United States Patent [19]

Sakurai et al.

[11] 3,905,819

[45] Sept. 16, 1975

[54] PHOTOPOLYMER PRINTING PLATE IMPROVED IN WATER RESISTANCE AND ITS PREPARATION

[75] Inventors: Kiyomi Sakurai, Hirakata; Yutaka Fukushima, Suita; Yasuyuki Takimoto, Takatsuki, all of Japan

[73] Assignee: Nippon Paint Co., Ltd., Japan

[22] Filed: Dec. 6, 1973

[21] Appl. No.: 422,203

[30] Foreign Application Priority Data

Dec. 15, 1972 Japan .............................. 47-126569

[52] U.S. Cl. .................. 96/35.1; 96/36.3; 96/115 P

[51] Int. Cl.$^2$ ........................ G03C 1/68; G03C 5/00

[58] Field of Search ................. 96/35.1, 36.3, 115 P

[56] References Cited

UNITED STATES PATENTS

| | | | |
|---|---|---|---|
| 2,367,511 | 1/1945 | Lowe et al. | 96/114 |
| 2,481,676 | 9/1949 | Lowe | 96/111 |
| 2,593,912 | 4/1952 | Orinik | 96/111 |
| 2,652,345 | 9/1953 | Jones | 96/111 |
| 2,927,023 | 3/1960 | Martin | 96/35.1 |
| 3,097,097 | 7/1963 | Oster et al. | 96/35.1 |
| 3,801,328 | 4/1974 | Takimoto et al. | 96/35.1 |

*Primary Examiner*—Ronald H. Smith
*Attorney, Agent, or Firm*—Wenderoth, Lind & Ponack

[57] ABSTRACT

A method for making water-resistant a water developed photopolymer printing plate obtained by exposing a photopolymer printing plate in the close contact with a negative to a light and developing the resulting plate with water, the said photopolymer printing plate essentially consisting of a support material and a layer of a water-soluble photosensitive resin composition comprising a water-soluble polymer, an acrylic monomer and a photopolymerization initiator provided thereon intervening or not an anti-halation layer between them, which comprises treating the water developed photopolymer printing plate with an aldehyde so as to acetalize the hydroxyl groups in the molecules of the water-soluble polymer included in the water-soluble photosensitive resin composition.

7 Claims, No Drawings

PHOTOPOLYMER PRINTING PLATE IMPROVED IN WATER RESISTANCE AND ITS PREPARATION

The present invention relates to a photopolymer printing plate improved in water resistance and its preparation. More particularly, it relates to a method for making water-resistant a water developed photopolymer printing plate.

With a remarkable improvement in photopolymer printing plates, their use as a directly printing plate has been increased gradually. The photopolymer printing plate, however, has not come into wide use due to its high price compared with a conventional metal plate despite its advantages of easy platemaking and free of public hazard. Nevertheless, there is an indication that these advantages of the photopolymer printing plate have been recognized by newspaper publishers and printing shops to adopt the said plate not as a printing plate but as a mother plate. This may indicate their use of a duplicate plate to necessitate the production of a large quantity of printed materials at a time. Namely, a matrix (negative pattern) is made from a mother plate, thereby a duplicate plate (positive pattern) is produced. For the mother plate, a make-up is generally composed of lead printing type for letters and metal plate for half tones, headings, weather charts and comic strips. For further production of a duplicate plate, a method being adopted is to make the mat from the make-up as matrix and duplicate the lead plate. In application of photopolymer printing plate for the said mother plate, it is possible to duplicate plural number of lead plates from one sheet of photopolymer printing plate through the mat. Furthermore, photopolymer printing plate is sufficiently of practical use because the metal plate in the make-up can also be replaced by the photopolymer printing plate even in due consideration of its high cost. Since the photopolymer printing plate presently sold at a market has plasticity in its property, it is impossible to use for making a mat, because it can not stand to a high pressure as applied on such making and line drawing may be defaced. However, the photopolymer printing plate for which a polymer compound having hydroxyl groups is used has various advantages in addition to the water developability. For instance, it is of high flexibility and print resistance under an appropriately wet condition since water may be regarded as a suitable plasticizer for the polymer compound. Further, for instance, the hardness is highly increased under an excessively dried condition so that it becomes utilizable as a mother plate material for making a mat. The said excessively dried condition can be attained by effecting the drying in a furnace kept at 100° to 120°C for a period of about 5 minutes. Because of this reason, the said photopolymer printing plate is particularly useful at such line of business as newspaper publishing where time restriction always exists.

The said photopolymer printing plate can be developed with water, because a water-soluble polymer is used as the main component. It is a printing plate material which can afford an excessive hardness quite easily so that a mat can be made in that condition. When water adheres to the plate, however, it is impossible to make a mat because water swells the plate to lower its hardness. Newspaper publishers presently use water in arrangement of a make-up to smoothen a hand composition in lead type, and if the plate is splashed with water, a mat cannot be made therewith. For this reason, the appearance of a photopolymer printing plate with a high water resistance has been desired. The use of such plate for a make-up can exterminate a metal plate which is conventionally used in the make-up. This will result in complete termination of the use of nitric acid in newspaper publishers for etching, and is remarkably effective in prevention of environmental pollution and improvement of working environment.

This invention provides a method for giving water resistance to a photopolymer printing plate comprising a water-soluble polymer having hydroxyl groups as the main components by simple post-treatment. Thus, according to the present invention, there is provided a method for making water-resistant a water developed photopolymer printing plate obtained by exposing a photopolymer printing plate in the close contact with a negative to a light and developing the resulting plate with water, the said photopolymer printing plate essentially consisting of a support material and a layer of a water-soluble photosensitive resin composition comprising a water-soluble polymer, an acrylic monomer and a photopolymerization initiator provided thereon intervening or not an anti-halation layer between them, which comprises treating the water developed photopolymer printing plate with an aldehyde so as to acetalize the hydroxyl groups in the molecules of the water-soluble polymer included in the water-soluble photosensitive resin composition.

The photopolymer printing plate used in this invention consists essentially of a support material and a layer of a water-soluble photosensitive resin composition comprising a water-soluble polymer, an acrylic monomer and a photopolymerization initiator provided thereon intervening or not an anti-halation layer between them.

As the support material, there may be used a metal plate (e.g. iron plate, tin plate, aluminum plate), a synthetic resin plate (e.g. vinyl chloride resin plate, polyester resin plate) or the like.

Examples of the water-soluble polymer available as a binder include partially saponified polyvinyl acetate, carbamyl polyvinyl alcohol, water-soluble cellulose derivatives such as methylcellulose, hydroxyethylcellulose, hydroxypropylmethylcellulose, etc.

As the acrylic monomer, there may be used the one which is compatible with the water-soluble polymer and has a boiling point not lower than 100°C under normal pressure. Specific examples of the acrylic monomer include esters of ethyleneglycol with acrylic acid or methacrylic acid (e.g. 2-hydroxyethyl methacrylate, 2-hydroxyethyl acrylate, ethyleneglycol dimethacrylate, ethyleneglycol diacrylate, polyethyleneglycol dimethacrylate, polyethyleneglycol diacrylate), trimethylolalkane triacrylate, trimethylolalkane trimethacrylate, tetramethylolalkane triacrylate, tetramethylolalkane trimethacrylate, tetramethylolalkane tetraacrylate and tetramethylolalkane tetramethacrylate of which the alkane moiety is the one having one to five carbon atoms, etc. These acrylic monomers may be used alone or in combination.

The photopolymerization initiator may be any conventional one, and particularly preferred are benzoin methyl ether, benzoin ethyl ether, benzoin isopropyl ether, benzoin n-butyl ether, benzoin ocryl ether and so on due to their good compatibility with the water-soluble polymer and the acrylic monomer.

For preparation of the water-soluble photosensitive resin composition, the water-soluble polymer, the acrylic monomer and the photopolymerization initiator are mixed together usually in a proportion of 100 : 50–150 : 0.1–15 in weight. When desired, a conventional polymerization inhibitor, a conventional oxidation inhibitor or the like may be incorporated therein. The mixation of the said components may be carried out in the presence or absence of a suitable solvent. The resulting composition is then applied on the support material.

Some typical examples of the method for preparing the photopolymer printing plate are shown below wherein parts and % are by weight unless otherwise indicated.

METHOD 1

Partially saponified polyvinyl acetate (average degree of polymerization, 500; degree of saponification, 80.1 mol %) (100 parts) and water (80 parts) are mixed well in a kneader at 90° to 95°C for 30 minutes. After cooling to 60°C, a mixture of p-methoxyphenol (0.06 parts), 2,6-di-t-butyl-p-cresol (0.14 part), benzoin isopropyl ether (3 parts), trimethylolpropane trimethacrylate (10 parts), trimethylolpropane triacrylate (10 parts) and 2-hydroxyethyl methacrylate (80 parts) is dropwise added thereto in 30 minutes. After removal of bubbles under reduced pressure, the resulting resin is poured on an iron plate of 0.3 mm in thickness coated with an anti-halation agent. A polyvinyl chloride sheet of 0.5 mm in thick is placed thereon, and the piled materials are passed between two rolls of which the clearance is so set as to make 0.7 mm of the thickness of the resin layer. After cooling, the polyvinyl chloride sheet is peeled off, and the resin sheet is dried in a furnace at 60°C for 40 minutes to give a photopolymer printing plate.

METHOD 2

Hydroxypropylmethylcellulose (methoxy content, 28.6 %; hydroxypropoxy content, 10.2 %; viscosity in 2 % aqueous solution at 20°C, 10.3 cps) (100 parts) and a mixture of benzoin isopropyl ether (2.4 parts), 2,6-di-t-butyl-p-cresol (0.16 part), ethyleneglycol dimethacrylate (10 parts) and 2-hydroxyethyl methacrylate (70 parts) are mixed well in a mixer to give a white powdery resin. The resin is placed on an aluminum plate coated with an anti-halation agent and pressed by the use of a press having two plates heated at 110°C under a pressure of 10 kg/cm$^2$ for 2 minutes to give a photopolymer printing plate.

In preparation of a relief printing plate from the photopolymer printing plate, the use of a clear film of negative will result in the formation of an uneven surface of the finished printing plate due to the uneven contact of the photopolymer printing plate with the clear film of negative. Such unevenness can be removed by sanding the surface of the photopolymer printing plate. Such sanding may be effected by the use of a precision sanding machine such as a belt sander. In alternative, it may be accomplished by placing a metal plate or a synthetic resin plate having a ground surface of the photopolymer printing plate and pressing the piled material by the aid of an appropriate machine. Thus, sanding is preferred for assurance of the even and close contact of the photopolymer printing plate with the negative.

After exposing the photopolymer printing plate in the close contact with a negative to a light (e.g. ultraviolet rays) usually in a vacuum printer, the non-exposed area is rinsed with fresh water for development.

The surface of the thus developed relief plate is treated with an aldehyde usually in an aqueous medium. Examples of the aldehyde include monoaldehydes (e.g. formaldehyde, acetaldehyde, propionaldehyde, glyoxylic acid) and di-aldehydes (e.g. glyoxal). Among them, preferred are glyoxylic acid and glyoxal. The most preferable is an aqueous solution of glyoxal in a concentration of 1 to 40 % by weight, because such solution is non-toxic, incombustible and of easy handling. When the concentration is higher than 40 %, the resulting solution is made to viscous and sometimes produces precipitated crystals on storage, and thus it is not suitable for the practical use. Besides, such solution may include a silicone resin such as water-soluble silicone, silicone oil or silicone emulsion so as to increase the water resistance effect. Treatment with the aldehyde, usually in the form of an aqueous solution, may be effected in a per se conventional manner such as dipping, brush coating, spraying or aerosol spraying.

After the above treatment, the resulting plate is subjected to drying normally in a furnace maintained at 50° to 200°C (preferably 100° to 120°C) for a period of 3 to 10 minutes (preferably 4 to 5 minutes).

The thus obtained letter press printing plate, with which a mat may be manufactured, has a sufficient and satisfactory water resistance with a hardness equivalent to lead type.

As illustrated above, the present invention can make a water developed photopolymer printing plate sufficiently water-resistant by a simple operation. By the use of such plate, a mat is produced quite rapidly without causing any environmental pollution.

Practical and presently preferred embodiments of the invention are illustratively shown in the following Examples wherein parts and % are by weight unless otherwise indicated.

EXAMPLE 1

Two sheets of the photopolymer printing plate produced by Method 1 are each closely contacted with a negative of half tone and exposed for one minute in a vacuum printer to a 3 KW high pressure mercury lamp at a distance of 70 cm. The plates after exposure are sprayed with water for 4 minutes under a pressure of 4 kg/cm$^2$ to rinse the non-exposed area. Of the two plates after rinsing, one is dried in a dryer at 110°C for 5 minutes, and the other is dipped in 20 % aqueous solution of glyoxal for 2 seconds to moisten its surface evenly and then dried in a dryer at 110°C for 5 minutes. The letter press printing plates, after drying, are dipped in water at 25°C for 5 minutes for measurement of the decrease in hardness and the swelling volume by moisture.

The results are shown in Table 1, from which it is understood that the plate treated with glyoxal solution has a sufficient and satisfactory water resistance.

Table 1

| Type of plate \ Test item | Hardness before water dipping | Hardness after 5 min. water dipping | Swelling volume after 5 min. water dipping (μ) |
|---|---|---|---|
| Plate without glyoxal treatment | 83 | 65 | 40 |
| Plate with glyoxal treatment | 85 | 85 | 0 |

Notes:
1) Hardness was measured by BARCOL GYZL 936.
2) Swelling volume was measured by a micrometer.

EXAMPLE 2

Three sheets of the photopolymer printing plate produced by Method 2 are each closely contacted with a negative of half tone and exposed for 1 minute by a 3 KW high pressure mercury lamp at a distance of 70 cm. The plates, after exposure, are sprayed with water for 4 minutes under a water pressure of 4 $kg/cm^2$ for rinsing. Of the three plates after rinsing, one is left as it is, another is subjected to spraying with 20 % aqueous solution of glyoxal and the rest to spraying with 20 % aqueous solution of glyoxal containing 0.02 % of silicone. Each of the said plates is dried in a dryer at 110°C for 5 minutes. Three letter press printing plates, are tested by water dipping as in Example 1.

The results are shown in Table 2, from which it is understood that the plates treated with glyoxal solution has a sufficient and satisfactory water resistance.

Table 2

| Type of plate \ Test item | Hardness before water dipping | Hardness after 5 min. water dipping | Swelling volume after 5 min. water dipping (μ) |
|---|---|---|---|
| Plate without glyoxal treatment | 85 | 70 | 38 |
| Plate with glyoxal treatment | 87 | 87 | 0 |
| Plate with silicone containing glyoxal treatment | 87 | 87 | 0 |

EXAMPLE 3

Of two sheets of the photopolymer printing plate of 1 mm in thickness, one is processed without treatment of glyoxal solution and the other with treatment of glyoxal solution as in Example 1. Water is applied on these two letter press printing plates, which are allowed to stand for 5 minutes. Thereafter, a mat having 0.9 mm in thickness is placed on each of the said plates, and a buffer material consisting of a fiber sheet of 1.5 mm thick, a cork sheet of 5.5 mm thick and a polyvinyl chloride sheet of 0.2 mm thick is put thereon. The piled materials are passed through a rolling machine of which the clearance is 5.7 mm for mat making. The resulting mat is dried at 130°C for 1.5 minutes, and melted lead is poured therein to make a lead plate. As the result of printing by a letter press using the lead plate, it is recognized that the printed surface in case of using the plate without glyoxal solution treatment is defaced and no clear print is obtained, whereas the printed surface in case of using the plate with glyoxal solution treatment is fine and clear.

EXAMPLE 4

A mixture of 15 % aqueous solution of glyoxal (20 parts) and an anionic surfactant (sodium dialkylsulfosuccinate; "Neocol" manufactured by Daiichi Kogyo Seiyaku Co., Ltd.) as an anti-foaming agent (0.02 part) is admitted in an aluminum can with a valve. After crimping the valve, dimethyl ether (5 parts) is charged therein to give an aerosol. The aerosol is evenly sprayed on the surface of the plate after rinsing in Example 1, and drying in a dryer at 110°C is carried out for 5 minutes. The letter press printing after drying is subjected to the same water dipping test as in Example 1 to show a sufficient and satisfactory water resistance.

What is claimed is:

1. A method for imparting water-resistance to a water developed photopolymer printing plate obtained by exposing a photopolymer printing plate, which is in close contact with a negative, to light and developing the resulting plate with water, said photopolymer printing plate consisting essentially of a support material and a layer thereupon of a water-soluble photosensitive resin composition comprising a water-soluble polymer containing hydroxyl groups, an acrylic monomer and a photopolymerization initiator, said method comprising the step of treating the surface of the water developed photopolymer printing plate with an aldehyde selected from the group consisting of glyoxylic acid and glyoxal in such amounts so as to acetalize the hydroxyl groups in the molecules of the water-soluble polymer in the water-soluble photosensitive composition.

2. The method according to claim 1, wherein the water-soluble polymer is a partially saponified polyvinyl acetate or hydroxypropylmethylcellulose.

3. The method according to claim 1, wherein the treatment is effected by dipping the water developed photopolymer printing plate in an aqueous solution containing an aldehyde, followed by drying.

4. The method according to claim 1, wherein the treatment is effected by spraying an aqueous solution containing an aldehyde on the water developed photopolymer printing plate, followed by drying.

5. The method according to claim 4, wherein the aqueous solution containing an aldehyde is used in the form of an aerosol.

6. A method according to claim 1, wherein the water-soluble polymer containing hydroxyl groups is selected from the groups consisting of a partially saponified polyvinyl acetate, carbamyl polyvinyl alcohol, and a water-soluble cellulose derivative and the acrylic monomer is at least one memeber selected from the group consisting of ethylene glycol esters of acrylic acid or methacrylic acid, trimethylolalkane triacrylate, trimethylolalkane trimethacrylate, tetramethylolalkane triacrylate, tetramethylolalkane trimethacrylate, tetramethylolalkane tetracrylate and tetramethylolalkane tetramethacrylate, wherein the alkane moiety has 1–5 carbon atoms.

7. The method according to claim 1, wherein an antihalation layer is provided between the support material and the layer of the water-soluble photosensitive resin composition.

* * * * *